(12) United States Patent (10) Patent No.: US 12,672,486 B2

Umeda (45) Date of Patent: *Jun. 30, 2026

(54) PIEZOELECTRIC FILM-ATTACHED SUBSTRATE AND PIEZOELECTRIC ELEMENT

(71) Applicant: FUJIFILM Corporation, Tokyo (JP)

(72) Inventor: Kenichi Umeda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 828 days.

This patent is subject to a terminal disclaimer.

(21) Appl. No.: 18/159,139

(22) Filed: Jan. 25, 2023

(65) Prior Publication Data

US 2023/0165149 A1 May 25, 2023

Related U.S. Application Data

(63) Continuation of application No. PCT/JP2021/020014, filed on May 26, 2021.

(30) Foreign Application Priority Data

Jul. 28, 2020 (JP) ................................. 2020-127689

(51) Int. Cl.
H10N 30/00 (2023.01)
H10N 30/853 (2023.01)

(52) U.S. Cl.
CPC ....... H10N 30/708 (2024.05); H10N 30/8548 (2023.02)

(58) Field of Classification Search
CPC ............. H10N 30/708; H10N 30/8548; H10N 30/076; H10N 30/079; H10N 30/8554;
(Continued)

(56) References Cited

U.S. PATENT DOCUMENTS

| | | | |
|---|---|---|---|
| 7,622,850 B2 | 11/2009 | Iwashita et al. | |
| 11,985,899 B2 | 5/2024 | Umeda et al. | |

(Continued)

FOREIGN PATENT DOCUMENTS

| | | |
|---|---|---|
| EP | 3 159 428 A1 | 4/2017 |
| JP | 7-142600 A | 6/1995 |

(Continued)

OTHER PUBLICATIONS

Extended European Search Report for corresponding European Application No. 21850647.5, dated Dec. 15, 2023.

(Continued)

*Primary Examiner* — Emily P Pham

(74) *Attorney, Agent, or Firm* — Birch, Stewart, Kolasch & Birch, LLP

(57) ABSTRACT

There are provided a piezoelectric film-attached substrate and piezoelectric element, which include, on a substrate in the following order, a lower electrode layer, a piezoelectric film containing a perovskite-type oxide containing lead as a main component of an A site, and a buffer layer, where the buffer layer contains a metal oxide represented by $M_d N_{1-d} O_e$. Here, M consists of one or more metal elements substitutable for the A site of the perovskite-type oxide and has an electronegativity of less than 0.95. In a case of $0 < d < 1$ and in a case where the electronegativity is denoted by X, $1.41X - 1.05 \leq d \leq A1 \cdot \exp(-X/t1) + y0$, where $A1 = 1.68 \times 10^{12}$, $t1 = 0.0306$, and $y0 = 0.59958$.

9 Claims, 3 Drawing Sheets

(58) Field of Classification Search

CPC .......... H10N 30/877; C04B 2235/3213; C04B 2235/3215; C04B 2235/3224; C04B 2235/3239; C04B 2235/3241; C04B 2235/3244; C04B 2235/3256; C04B 2235/3258; C04B 2235/3262; C04B 2235/3272; C04B 2235/3275; C04B 2235/3279; C04B 2235/3281; C04B 2235/3284; C04B 2235/3286; C04B 2235/3293; C04B 2235/3294; C04B 2235/768; C04B 2235/94; C04B 2235/3251; C04B 2235/3255; C04B 2235/3289; C04B 35/62218; C04B 35/62222; C04B 35/4682; C04B 35/493; C30B 25/06; C30B 29/32; C23C 14/088

See application file for complete search history.

(56)       References Cited

U.S. PATENT DOCUMENTS

| | | | |
|---|---|---|---|
| 2004/0084994 A1 | 5/2004 | Iwashita et al. | |
| 2006/0138906 A1 | 6/2006 | Iwashita et al. | |
| 2006/0139414 A1 | 6/2006 | Iwashita et al. | |
| 2006/0214542 A1 | 9/2006 | Iwashita et al. | |
| 2008/0024563 A1 | 1/2008 | Matsui et al. | |
| 2013/0070029 A1 | 3/2013 | Mizukami et al. | |
| 2013/0250009 A1 | 9/2013 | Ishimori et al. | |
| 2015/0232346 A1 | 8/2015 | Kijima et al. | |
| 2017/0133581 A1 | 5/2017 | Kobayashi et al. | |
| 2018/0287045 A1 | 10/2018 | Tabuchi et al. | |
| 2019/0013459 A1 | 1/2019 | Kijima et al. | |
| 2019/0081230 A1 | 3/2019 | Nomura et al. | |
| 2019/0097121 A1* | 3/2019 | Sawaki | H10N 30/853 |
| 2020/0091403 A1* | 3/2020 | Xiong | H10N 30/05 |
| 2023/0165149 A1 | 5/2023 | Umeda | |

FOREIGN PATENT DOCUMENTS

| | | |
|---|---|---|
| JP | 2001-223403 A | 8/2001 |
| JP | 2005-166912 A | 6/2005 |
| JP | 2006-69837 A | 3/2006 |
| JP | 2006-186258 A | 7/2006 |
| JP | 2006-186259 A | 7/2006 |
| JP | 2006-269957 A | 10/2006 |
| JP | 2013-65699 A | 4/2013 |
| JP | 2013-201198 A | 10/2013 |
| JP | 2019-16793 A | 1/2019 |
| JP | 2019-47114 A | 3/2019 |
| WO | WO 2005/036612 A2 | 4/2005 |
| WO | WO 2014/007015 A1 | 1/2014 |
| WO | WO 2015/194458 A1 | 12/2015 |
| WO | WO 2017/043383 A1 | 3/2017 |

OTHER PUBLICATIONS

Extended European Search Report for European Application No. 20823705.7, dated Aug. 12, 2022.

International Preliminary Report on Patentability and Written Opinion of the International Searching Authority (Forms PCT/IB/326, PCT/IB/373, and PCT/ISA/237) for International Application No. PCT/JP2020/018079, dated Dec. 23, 2021, with an English translation.

International Search Report (Form PCT/ISA/210) for International Application No. PCT/JP2020/018079, dated Jul. 14, 2020, with an English translation.

Japanese Office Action for Japanese Application No. 2021-525938, dated Jul. 26, 2022, with English translation.

U.S. Notice of Allowance for U.S. Appl. No. 17/539,343, dated Jun. 24, 2025.

U.S. Office Action for U.S. Appl. No. 17/539,343, dated Mar. 5, 2025.

International Preliminary Report on Patentability and Written Opinion of the International Searching Authority (Forms PCT/IB/326, PCT/IB/373, and PCT/ISA/237) for International Application No. PCT/JP2021/020014, dated Feb. 9, 2023, with an English translation.

International Search Report (Form PCT/ISA/210) for International Application No. PCT/JP2021/020014, dated Aug. 24, 2021, with an English translation.

Japanese Office Action for corresponding Japanese Application No. 2022-540036, dated Apr. 2, 2024, with an English translation.

* cited by examiner

PIEZOELECTRIC FILM-ATTACHED SUBSTRATE AND PIEZOELECTRIC ELEMENT

CROSS-REFERENCE TO RELATED APPLICATIONS

This application is a continuation of International Application No. PCT/JP2021/020014, filed on May 26, 2021, which claims priority from Japanese Patent Application No. 2020-127689, filed on Jul. 28, 2020. The entire disclosure of each of the above applications is incorporated herein by reference.

BACKGROUND

Technical Field

The present disclosure relates to a piezoelectric film-attached substrate and a piezoelectric element.

Related Art

As a material having excellent piezoelectricity and excellent ferroelectricity, there is known lead zirconate titanate (Pb(Zr, Ti)O$_3$, hereinafter referred to as PZT). The PZT is used in a ferroelectric random access memory (FeRAM) which is a non-volatile memory, by taking advantage of the ferroelectricity thereof. Furthermore, in recent years, a MEMS piezoelectric element including a PZT film has been put into practical use by fusing with micro electro-mechanical systems (MEMS) technology. The PZT film has been developed into various devices such as a memory, an inkjet head (an actuator), a micromirror device, an angular velocity sensor, a gyro sensor, and an oscillation power generation device.

A PZT film that realizes the excellent piezoelectricity required for the above-described various devices is composed of crystals having a perovskite structure. However, since lead (Pb) is a highly volatile and extremely unstable element, it is difficult to stably form a perovskite structure. As a result, in a case where a PZT film is formed on a substrate, a pyrochlore phase may be formed in an interface region where the initial nuclei are formed. The pyrochlore phase is likely to be a starting point of peeling, and a decrease in piezoelectricity tends to occur in a case where a pyrochlore phase is provided. Therefore, a method for stably forming a perovskite structure without forming a pyrochlore phase has been proposed.

For example, it has been studied to introduce a growth control layer (also referred to as a seed layer or an alignment control layer) into an underlayer of a PZT film. JP2006-069837A proposes providing YBa$_2$Cu$_3$O$_{7-\delta}$ in an underlayer of a piezoelectric film in order to obtain a PZT film having a stable perovskite phase.

On the other hand, in a piezoelectric element including a lower electrode, a piezoelectric film, and an upper electrode on a substrate, it is known that there is a problem that the piezoelectric constant d$_{31}$ (the piezoelectric constant with respect to a direction along an electrode surface) of the piezoelectric element decreases in a case where an alternating current voltage is applied for a predetermined time (see WO2017/043383A). WO2017/043383A proposes a piezoelectric element in which a decrease in piezoelectric constant is suppressed by providing a metal oxide layer containing an amorphous portion in an upper layer of the piezoelectric film. Examples of the metal oxide layer include strontium ruthenate (SrRuO$_3$), lithium nickelate, and ruthenium oxide. WO2017/043383A describes that a metal oxide layer including the amorphous portion has a function as a barrier layer that suppresses the movement of oxygen of a piezoelectric film to an electrode layer, and due to this function, a decrease in the piezoelectric constant of the piezoelectric element can be suppressed.

SUMMARY

In an actual device to which a piezoelectric element including a PZT film is applied, in a case where a voltage is applied for a predetermined time, there is a problem that a decrease in piezoelectric performance such as a decrease in piezoelectric constant or a decrease in capacitance occurs and long-term reliability cannot be obtained. The inventors of the present invention have presumed that this decrease in piezoelectricity is due to the migration of Pb and have studied a method of suppressing the decrease in piezoelectricity due to the migration of Pb.

WO2017/043383A discloses that a decrease in piezoelectric constant can be suppressed by providing an amorphous metal oxide layer on an upper layer of a piezoelectric film regardless of whether or not Pb is contained. However, WO2017/043383A does not describe the migration of Pb in a piezoelectric film consisting of a perovskite-type oxide containing Pb and has not studied a layer configuration (composition) particularly suitable for a piezoelectric film containing a perovskite-type oxide containing Pb.

The problem of the decrease in piezoelectricity due to the migration of Pb is not limited to the PZT film, and it is a problem common to piezoelectric films containing a perovskite-type oxide containing Pb.

The present disclosure has been made in consideration of the above circumstances, and an object of the present disclosure is to provide a piezoelectric film-attached substrate including a piezoelectric film containing a perovskite-type oxide containing Pb, the piezoelectric film-attached substrate being capable of improving long-term reliability in a case where of being applied as a piezoelectric element including an upper electrode layer, and provide a piezoelectric element having high long-term reliability.

Specific means for solving the above problems include the following aspects.

<1> A piezoelectric film-attached substrate comprising, on a substrate in the following order:

a lower electrode layer;

a piezoelectric film; and a buffer layer, in which the piezoelectric film contains a perovskite-type oxide represented by General Formula ABO$_3$, the perovskite-type oxide containing lead as a main component of an A site, the buffer layer contains a first metal oxide represented by General Formula (1), $$M_d N_{1-d} O_e \tag{1}$$

M consists of one or more metal elements substitutable for the A site of the perovskite-type oxide and has an electronegativity of less than 0.95, N includes, as a main component, at least one selected from the group of Sc, Zr, V, Nb, Ta, Cr, Mo, W, Mn, Fe, Ru, Co, Ir, Ni, Cu, Zn, Ga, Sn, In, and Sb, O is an oxygen element, and d and e represent a compositional ratio, which satisfies 0<d<1 and 1≤e≤3, and in a case where the electronegativity is denoted by X, $$1.41X-1.05 \leq d \leq A1 \cdot \exp(-X/t1)+y0$$

$A1=1.68\times10^{12}$, $t1=0.0306$, and $y0=0.59958$.

<2> The piezoelectric film-attached substrate according to <1>, further comprising a growth control layer between the lower electrode layer and the piezoelectric film, in which the growth control layer contains a second metal oxide represented by General Formula (1).

<3> The piezoelectric film-attached substrate according to <1> or <2>, in which in the first metal oxide contained in the buffer layer, M of General Formula (1) includes, as a main component, at least one selected from the group of Li, Na, K, Mg, Ca, Sr, Ba, La, Cd, and Bi.

<4> The piezoelectric film-attached substrate according to <1> or <2>, in which in the first metal oxide contained in the buffer layer, M of General Formula (1) contains Ba as a main component.

<5> The piezoelectric film-attached substrate according to <1> or <2>, in which in the first metal oxide contained in the buffer layer, M of General Formula (1) is Ba.

<6> The piezoelectric film-attached substrate according to any one of <1> to <5>, in which in the first metal oxide contained in the buffer layer, d in General Formula (1) is $$0.2 \leq d.$$

<7> The piezoelectric film-attached substrate according to any one of <1> to <5>, in which in the first metal oxide contained in the buffer layer, d in General Formula (1) is $$0.3 \leq d.$$

<8> The piezoelectric film-attached substrate according to any one of <1> to <5>, in which in the first metal oxide contained in the buffer layer, d in General Formula (1) is $$0.45 \leq d.$$

<9> A piezoelectric element comprising:

the piezoelectric film-attached substrate according to any one of <1> to <8>; and an upper electrode layer provided on the buffer layer.

According to the present disclosure, it is possible to provide a piezoelectric film-attached substrate including a piezoelectric film containing a perovskite-type oxide containing Pb, the piezoelectric film-attached substrate being capable of improving long-term reliability in a case where of being applied as a piezoelectric element including an upper electrode layer, and provide a piezoelectric element having high long-term reliability.

BRIEF DESCRIPTION OF THE DRAWINGS

FIG. 1 is a cross-sectional view illustrating a layer configuration of a piezoelectric element according to a first embodiment.

FIG. 2 is a cross-sectional view illustrating a layer configuration of a piezoelectric element according to a second embodiment.

DESCRIPTION OF EMBODIMENTS

Figure 3:
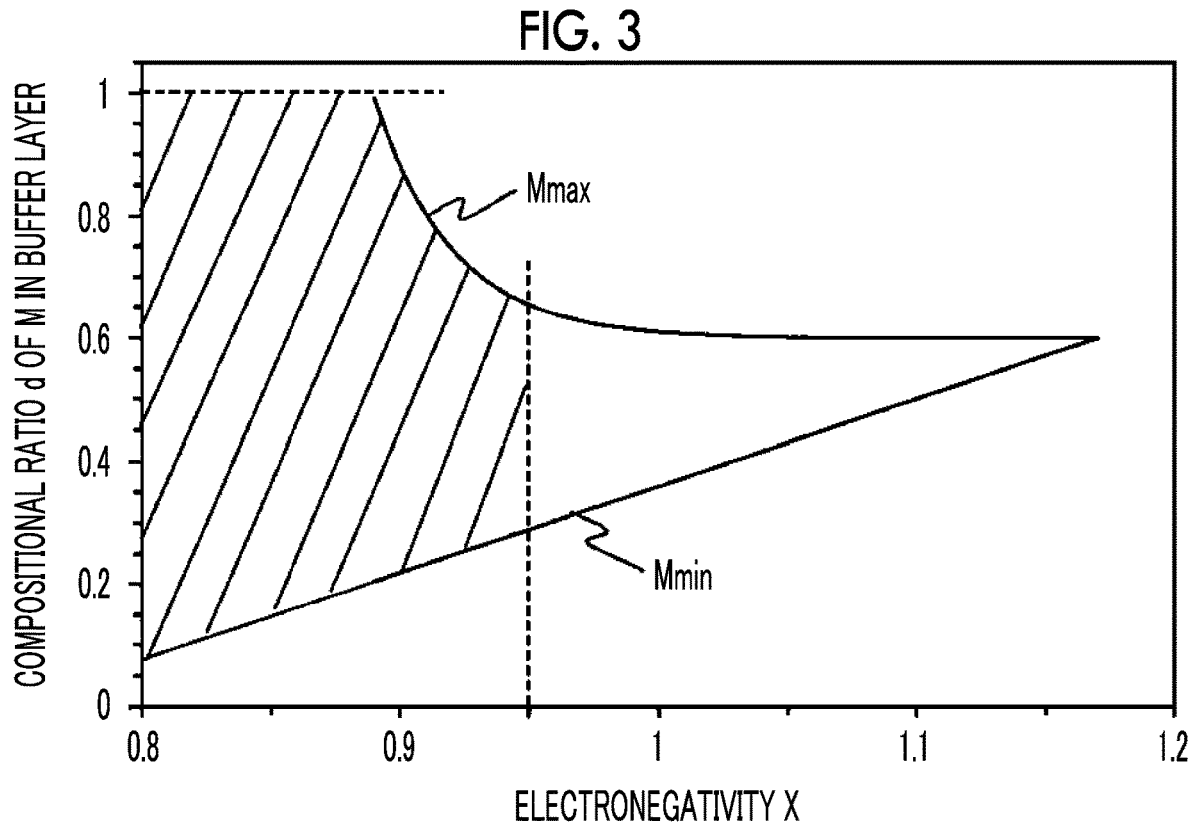
FIG. 3 is a graph showing a preferred region of an electronegativity and a compositional ratio d for an element M constituting a buffer layer.

Hereinafter, embodiments according to the present invention will be described with reference to the drawings. In the drawings below, the layer thickness of each of the layers and the ratio therebetween are appropriately changed and drawn for easy visibility, and thus they do not necessarily reflect the actual layer thickness and ratio.

Piezoelectric Element According to First Embodiment

Figures 1, 2:
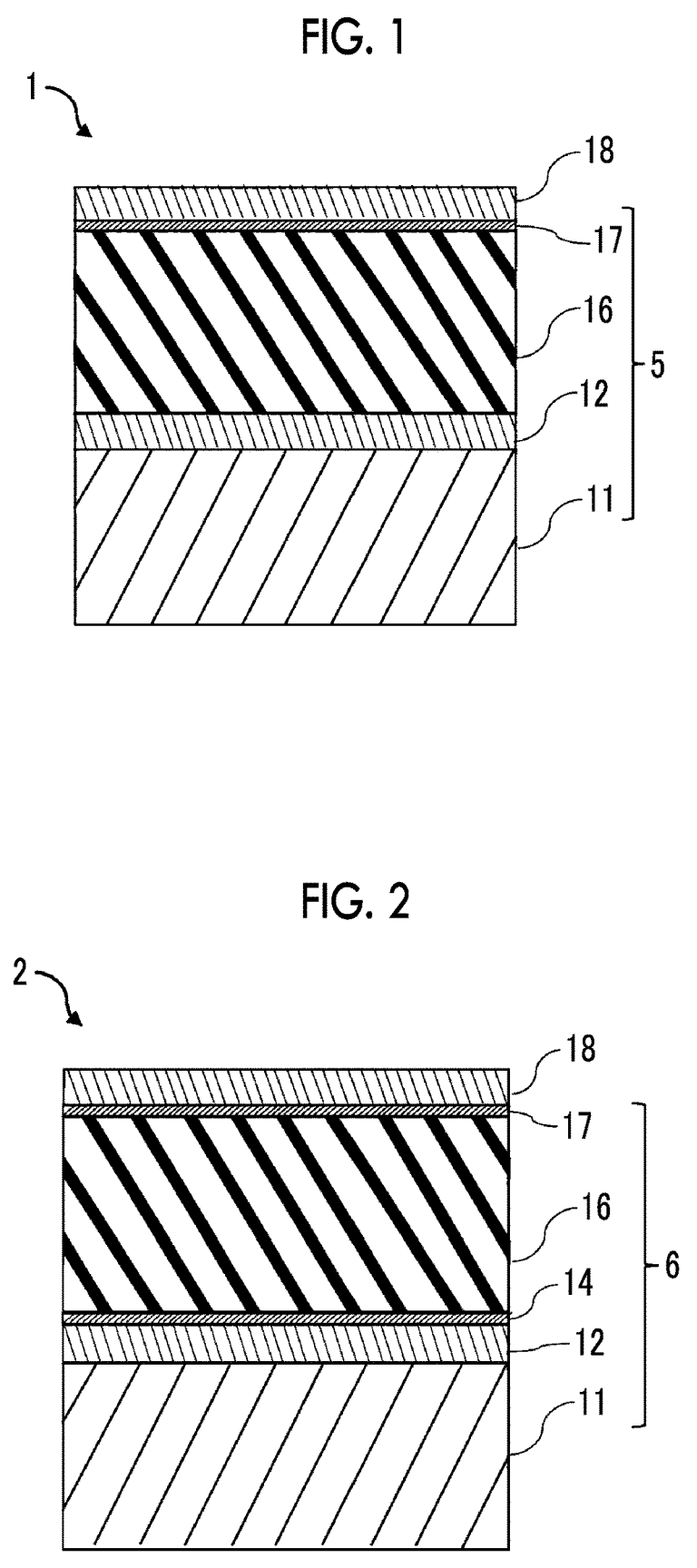

FIG. 1 is a schematic cross-sectional view illustrating a layer configuration of a piezoelectric element 1 according to a first embodiment, which includes a piezoelectric film-attached substrate 5 according to an embodiment. As illustrated in FIG. 1, the piezoelectric element 1 has the piezoelectric film-attached substrate 5 and an upper electrode layer 18. The piezoelectric film-attached substrate 5 includes a lower electrode layer 12, a piezoelectric film 16, and a buffer layer 17 on a substrate 11 in this order. The piezoelectric element 1 is configured such that an electric field is applied to the piezoelectric film 16 in the layer thickness direction, by the lower electrode layer 12 and the upper electrode layer 18.

The substrate 11 is not particularly limited, and examples thereof include substrates such as silicon, glass, stainless steel (SUS), yttrium-stabilized zirconia (YSZ), alumina, sapphire, and silicon carbide. As the substrate 11, a laminated substrate having a $SiO_2$ oxide film formed on the surface of the silicon substrate may be used.

The lower electrode layer 12 is an electrode for applying a voltage to the piezoelectric film 16. The main component of the lower electrode layer 12 is not particularly limited, examples thereof include metals such as gold (Au), Pt, iridium (Ir), ruthenium (Ru), titanium (Ti), molybdenum (Mo), tantalum (Ta), aluminum (Al), copper (Cu), and silver (Ag), metal oxides such as indium oxide (ITO: indium tin oxide), iridium oxide ($IrO_2$), ruthenium oxide ($RuO_2$), $LaNiO_3$, and $SrRuO_3$, and combinations thereof. It is particularly preferable to use Ir as the lower electrode layer 12.

The upper electrode layer 18 is paired with the lower electrode layer 12 and is an electrode for applying a voltage to the piezoelectric film 16. The main component of the upper electrode layer 18 is not particularly limited, and examples thereof include, in addition to the materials exemplified in the lower electrode layer 12, electrode materials that are generally used in a semiconductor process such as chromium (Cr) and a combination thereof.

Here, "lower" and "upper" do not respectively mean top and bottom in the vertical direction. As result, an electrode arranged on the side of the substrate with the piezoelectric film being interposed is merely referred to as the lower electrode, and an electrode arranged on the side of the piezoelectric film opposite to the substrate is merely referred to as the upper electrode.

The layer thicknesses of the lower electrode layer 12 and the upper electrode layer 18 are not particularly limited and are preferably about 50 nm to 300 nm.

The piezoelectric film 16 contains a perovskite-type oxide containing Pb as a main component of an A site in a perovskite-type oxide represented by General Formula $ABO_3$ (hereinafter, referred to as a Pb-containing perovskite-type oxide). Here, A is an A site element of a perovskite structure, B is a B site element having a perovskite structure, and O is an oxygen element. The piezoelectric film 16 basically consists of a Pb-containing perovskite-type oxide. However, the piezoelectric film 16 may contain unavoidable impurities in addition to the Pb-containing perovskite-type oxide. The perovskite-type oxide is represented by General Formula $ABO_3$. It is noted that in the present specification, "the main component" means a component of which the occupation is 50% by mole or more. That is, "containing Pb as a main component of an A site" means that the component having 50% by mole or more among the A site elements is Pb. In the Pb-containing perovskite oxide, an element in the A site other than Pb and an element of the B site are not particularly limited.

The Pb-containing perovskite-type oxide is, for example, preferably a perovskite-type oxide represented by General Formula (2) below.

$$(Pb_{a1}\alpha_{a2})(Zr_{b1}Ti_{b2}\beta_{b3})O_c \qquad (2)$$

In the formula, Pb and a are an A site element, where $\alpha$ is at least one kind of element other than Pb. Zr, Ti, and $\beta$ are a B site element. Here, $a1 \geq 0.5$, $b1 > 0$, $b2 > 0$, and $b3 \geq 0$, and $(a1+a2):(b1+b2+b3):c=1:1:3$ are standardly satisfied, which may deviate from the standard values within a range in which a perovskite structure can be obtained.

In the Pb-containing perovskite-type oxide, examples of the A site element other than Pb include lithium (Li), sodium (Na), potassium (K), magnesium (Mg), calcium (Ca), strontium (Sr), barium (Ba), lanthanum (La), cadmium (Cd), and bismuth (Bi). $\alpha$ is one of these or a combination of two or more of these.

Examples of the B site element other than Ti and Zr include scandium (Sc), vanadium (V), niobium (Nb), tantalum (Ta), chromium (Cr), molybdenum (Mo), tungsten (W), manganese (Mn), iron (Fe), ruthenium (Ru), cobalt (Co), iridium (Ir), nickel (Ni), copper (Cu), zinc (Zn), gallium (Ga), indium (In), tin (Sn), and antimony (Sb). $\beta$ is one of these or a combination of two or more of these.

The layer thickness of the piezoelectric film 16 is not particularly limited, and it is generally 200 nm or more, for example, 0.2 μm to 5 μm. The layer thickness of the piezoelectric film 16 is preferably 1 μm or more.

The buffer layer 17 contains a first metal oxide represented by General Formula (1). The buffer layer 17 basically consists of a first metal oxide represented by General Formula (1). However, the buffer layer 17 may contain unavoidable impurities.

$$M_dN_{1-d}O_e \qquad (1)$$

Here, M consists of one or more metal elements substitutable for the A site of the Pb-containing perovskite-type oxide provided in the upper layer of the buffer layer 17 and has an electronegativity of less than 0.95. M preferably includes, as a main component, at least one selected from the group of Li, Na, K, Mg, Ca, Sr, Ba, La, Cd, and Bi in a range in which the electronegativity is less than 0.95. In the present specification, "includes at least one as a main component" means that the main component may be composed of only one element or a combination of two or more elements may be included as the main component. M may include a metal element substitutable for the A site other than the metal element. In a case where M consists of two or more metal elements, the electronegativity of M shall be the sum of the electronegativity of each metal element×the content proportion of the metal element in M.

N includes, as a main component, at least one selected from the group of Sc, Zr, V, Nb, Ta, Cr, Mo, W, Mn, Fe, Ru, Co, Ir, Sn, Ni, Cu, Zn, Ga, In, and Sb. N consists of a metal species capable of functioning as a B site element in the Pb-containing perovskite-type oxide. N may include a B site element other than the above-described metal element.

O is an oxygen element.

In addition, d and e represent a compositional ratio, which satisfies $0<d<1$ and $1 \leq e \leq 3$, and in a case where the electronegativity of M is denoted by X, $$1.41X-1.05 \leq d \leq A1 \cdot \exp(-X/t1)+y0$$

Here, $A1=1.68 \times 10^{12}$, $t1=0.0306$, and $y0=0.59958$.

It is noted that the compositional ratio e varies depending on the valences and the compositional ratios of M and N.

It is noted that whether or not being a metal element substitutable for the A site or an element substitutable for the B site of the Pb-containing perovskite-type oxide is determined by the relative size of the three kinds of ions A, B, and O, that is, the ion radius thereof. According to Netsu Sokutei 26 (3) 64-75, in the perovskite-type oxide, the A site is 12-coordinated, and the B site is 6-coordinated, and thus the adoption of the perovskite-type structure depends on the size of layers of AO and $BO_2$, which are stacked alternately. The tolerance factor t indicates this as a quantitative scale, which is expressed by the following expression.

$$t=(rA+rO)/\{\sqrt{2}(rB+rO)\}$$

Here, rA, rB, and rO are ion radii of the A, B, and O ions at the respective positions.

Generally, the perovskite-type oxide appears at around t=1.05 to 0.90, and an ideal perovskite-type structure is realized at t=1. In the present specification, the element substitutable for the A site and the element substitutable for the B site are defined as those having a tolerance factor of 1.05 to 0.90. It is noted that as the ion radius, those in the ion radius table created by Shannon are used. The ion radius of Shannon is described in R. D. Schannon, Acta Crystallogr. A32, 751 (1976).

FIG. 3 shows a range of the composition d of the metal M and the electronegativity X in the buffer layer 17 in the present embodiment. In FIG. 3, $$M_{max}=A1 \cdot \exp(-X/t1)+y0$$

$$M_{min}=1.41X-1.05$$

The range taken by the composition d of the metal M and the electronegativity X in the buffer layer 17 is a region sandwiched between the straight line of $M_{min}$, and the curve of $M_{max}$, which is a region indicated by diagonal lines in the figure, where the electronegativity is 0.95 or less and the compositional ratio d is 1 or less.

The inventors of the present invention have found that in the piezoelectric element 1 including the piezoelectric film 16 consisting of a perovskite-type oxide containing Pb, long-term reliability is improved in a case where the buffer layer 17 satisfying the above-described conditions is included, as compared with a piezoelectric film in the related art including a piezoelectric film consisting of a perovskite-type oxide containing Pb (see Test 1 described later).

In a case of setting the compositional ratio of M in the above range with the electronegativity X of M, as a parameter, the M being a metal element substitutable for the A site in the buffer layer 17, the decrease in the piezoelectricity of the piezoelectric film 16 can be suppressed even in a case where the piezoelectric element 1 is driven for a long time.

As described above, Pb in the Pb-containing perovskite-type oxide constituting the piezoelectric film is likely to be migrated by applying an electric field to Pb for a long period of time, and this migration of Pb may cause a decrease in piezoelectric constant and a decrease in capacitance. However, since the buffer layer 17 contains an element substitutable for the A site of the Pb-containing perovskite oxide, it is conceived that a pseudo Pb atmosphere can be created in the vicinity of the interface where Pb is likely to be deficient and the stabilization of the perovskite structure can be achieved. It is conceived that a part of the A site of the perovskite structure at an interface of the piezoelectric film 16 with respect to the buffer layer 17 is composed of M of the buffer layer 17. However, since the entire region of the Pb-containing perovskite oxide constituting the piezoelectric film 16 is not doped with M, there is no effect on the piezoelectricity. In addition, since the perovskite structure is stabilized due to the action of M at the interface, a decrease in piezoelectric constant and a decrease in capacitance can be suppressed, and long-term reliability can be obtained. In particular, since an oxide containing a highly reactive metal element having an electronegativity of less than 0.95 is used as the buffer layer 17, the stabilization of the perovskite structure can be promoted, and long-term reliability can be improved. It is noted that since the allowable range of the compositional ratio d of $M_dN_{1-d}O_e$ is wide, it is possible to suppress the complication of the temperature control in a case where the area is increased at the time of formation of a film of the growth control layer, and it is possible to avoid cost increase.

In the buffer layer 17, it is preferable that M includes Ba as a main component. In a case of including 50% by mole or more of Ba in M, the allowable range of d can be significantly expanded. It is particularly preferable that M is Ba.

It is noted that in a case where M includes Ba, a higher effect of stabilization can be obtained as compared with a case where no buffer layer is provided or a case where a buffer layer that does not contain Ba is provided.

In $M_dN_{1-d}O_e$, $0.2 \leq d$ is preferable, $0.3 \leq d$ is more preferable, and $0.45 \leq d$ is particularly preferable.

In a case of setting d to 0.2 or more, it is possible to increase the choices of element species that can be used as M. In a case of setting d to 0.3 or more, it is possible to further increase the choices of element species that can be used as M, and in a case of setting d to 0.45 or more, it is possible to still further increase the choices of element species.

In addition, N is preferably Ru, Ir, Sn, Zr, Ta, Ni, Co, or Nb. In a case where N is this metal, it is easy to produce, at a high density, a target that is used at the time of the sputter film formation since different phases are unlikely to appear. In particular, in a case where Ru, Ir, and Sn are used, the buffer layer 17 having a high conductivity can be formed, and thus it is possible to make the buffer layer 17 function as a part of the upper electrode layer 18.

The layer thickness of the buffer layer 17 is preferably 0.5 nm or more and 200 nm or less, more preferably 1 nm or more and 100 m or less, and still more preferably 5 nm or more and 75 nm or less. In a case where the layer thickness of the buffer layer 17 is 0.5 nm or more, the effect of suppressing the migration of Pb can be sufficiently obtained. In addition, in a case of 200 nm or less, it is possible to achieve a function as an electrode capable of ensuring piezoelectric characteristics.

Piezoelectric Element According to Second Embodiment

FIG. 2 illustrates a layer configuration of a piezoelectric element according to a second embodiment. The same reference numerals are respectively assigned to the same elements as those of the piezoelectric element according to the first embodiment, and a detailed description thereof will be omitted.

As shown in FIG. 2, a piezoelectric element 2 according to the present embodiment includes a piezoelectric film-attached substrate 6 according to another embodiment and the upper electrode layer 18. The piezoelectric element 2 includes a growth control layer 14 between the lower electrode layer 12 and the piezoelectric film 16 in the piezoelectric element 1 according to the first embodiment. The piezoelectric film-attached substrate 6 includes the substrate 11, the lower electrode layer 12, the growth control layer 14, the piezoelectric film 16, and the buffer layer 17.

The buffer layer 17 is provided in this example as well, and thus similar to the piezoelectric element 1 according to the first embodiment, in the piezoelectric element 2 including the piezoelectric film 16 consisting of a perovskite-type oxide containing Pb, high long-term reliability can be obtained in a case where the buffer layer 17 satisfying General Formula (1) is included, as compared with a piezoelectric element in the related art including a piezoelectric film consisting of a perovskite-type oxide containing Pb.

Similar to the buffer layer 17, the growth control layer 14 contains a second metal oxide represented by General Formula (1). The growth control layer 14 basically consists of a second metal oxide represented by General Formula (1). However, the growth control layer 14 may contain unavoidable impurities.

$$M_dN_{1-d}O_e \quad\quad (1)$$

Here, M consists of one or more metal elements substitutable for the A site of the Pb-containing perovskite-type oxide provided in the upper layer of the growth control layer 14 and has an electronegativity of less than 0.95. M preferably includes, as a main component, at least one selected from the group of Li, Na, K, Mg, Ca, Sr, Ba, La, Cd, and Bi in a range in which the electronegativity is less than 0.95. In the present specification, "includes at least one as a main component" means that the main component may be composed of only one element or a combination of two or more elements may be included as the main component. M may include a metal element substitutable for the A site other than the metal element. In a case where M consists of two or more metal elements, the electronegativity of M shall be the sum of the electronegativity of each metal element x the content proportion of the metal element in M.

N includes, as a main component, at least one selected from the group of Sc, Zr, V, Nb, Ta, Cr, Mo, W, Mn, Fe, Ru, Co, Ir, Sn, Ni, Cu, Zn, Ga, In, and Sb. N consists of a metal species capable of functioning as a B site element in the Pb-containing perovskite-type oxide. N may include a B site element other than the above-described metal element.

O is an oxygen element.

In addition, d and e represent a compositional ratio, which satisfies $0 < d < 1$ and $1 \leq e \leq 3$, and in a case where the electronegativity of M is denoted by X, $$1.41X - 1.05 \leq d \leq A1 \cdot \exp(-X/t1) + y0$$

Here, $A1 = 1.68 \times 10^{12}$, $t1 = 0.0306$, and $y0 = 0.59958$.

It is noted that the compositional ratio e varies depending on the valences of M and N.

The second metal oxide constituting the growth control layer 14 and the first metal oxide constituting the buffer layer 17 may have the same composition or may be metal oxides which have compositions different from each other but satisfy General Formula (1). In a case where the first metal oxide has the same composition as that of the second metal oxide, the materials can be unified, and thus the manufacturing cost can be suppressed.

The inventors of the present invention have found that in a case of providing the growth control layer 14 satisfying the above-described conditions, it is possible to form the piezoelectric film 16 consisting of a single-phase perovskite-type oxide having no pyrochlore phase (see WO2020-250591A, WO2020-250632A, and JP2020-202327A, which have been filed earlier by the present applicant). Here, "having no pyrochlore phase" means that a diffraction peak of the pyrochlore phase is not observed in a general X-ray diffraction (XRD) measurement.

In a case of setting the compositional ratio of M in the above range with the electronegativity X of M, as a parameter, the M being a metal element substitutable for the A site in the growth control layer 14, it is possible to form a film of a single-layered Pb-containing perovskite-type oxide layer without causing a pyrochlore phase to appear.

The growth control layer 14 contains an element substitutable for the A site of the Pb-containing perovskite oxide. Therefore, it is conceived that in the vicinity of the interface where Pb is likely to be deficient in the piezoelectric film 16 in the piezoelectric element 2, it is possible to create a pseudo Pb atmosphere, and it is possible to stably form the perovskite structure from the time of the initial formation of the piezoelectric film 16. It is conceived that the A site of the perovskite structure at an interface of the piezoelectric film 16 with respect to the growth control layer 14 is partially composed of M of the growth control layer 14; however, there is no effect on the piezoelectricity since the entire region of the Pb-containing perovskite is not doped with M. In addition, since the perovskite structure is stabilized due to the action of M at the interface, it is possible to suppress the generation of the pyrochlore phase and it is possible to form the piezoelectric film without forming the pyrochlore phase. In particular, since an oxide containing a highly reactive metal element having an electronegativity of less than 0.95 is used as the growth control layer, the effect of complementing Pb-lost A sites is high in the initial stage of film formation. As a result, it is possible to promote the generation of the perovskite structure, and it is possible to allow the Pb-containing perovskite oxide to grow stably.

In the growth control layer 14 as well, similar to the buffer layer 17, it is preferable that M includes Ba as a main component, and it is particularly preferable that M is Ba. In a case where M includes Ba, it is possible to significantly reduce the film formation temperature of the piezoelectric film to be provided on the growth control layer as compared with a case where no growth control layer is provided and a case where a growth control layer that does not contain Ba is provided.

A preferred range of the compositional ratio d of M is the same as in the case of the buffer layer 17.

The layer thickness of the growth control layer 14 is preferably 0.63 nm or more and 170 nm or less, more preferably 0.63 nm or more and 40 nm or less, and particularly preferably 0.63 m or more and 10 nm or less. In a case where the layer thickness of the growth control layer 14 is 0.63 nm or more, the effect of suppressing the pyrochlore phase can be sufficiently obtained. In addition, in a case of being 40 nm or less, the effect of obtaining a favorable perovskite phase is high.

Further, in the growth control layer 14 as well, the metal N is preferably Ru, Ir, Sn, Zr, Ta, Ni, Co, or Nb. In a case where N is this metal, it is easy to produce, at a high density, a target that is used at the time of the sputter film formation since different phases are unlikely to appear. In particular, in a case of including Ru, Ir, and Sn, high conductivity can be obtained, and thus it is possible to make the growth control layer 14 function as a part of the lower electrode layer 12.

Test 1

A plurality of piezoelectric element samples differing in the composition of the buffer layer, sample Nos. 1 to 20, were prepared, and the composition of the buffer layer was determined based on the results of the evaluation of long-term drive. Hereinafter, a production method and an evaluation method for the piezoelectric element sample used for the evaluation will be described.

Figure 4:
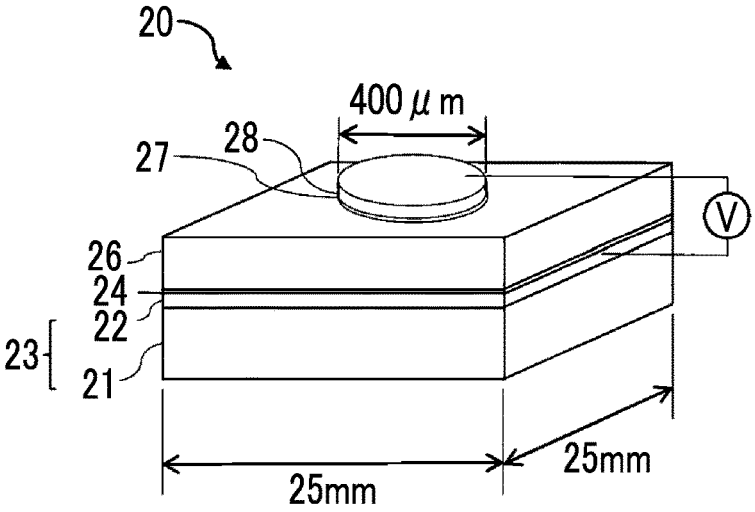
FIG. 4 is a view illustrating a schematic configuration of a piezoelectric element sample.

FIG. 4 is a view illustrating a schematic configuration of a piezoelectric element sample used in the evaluation of long-term drive. A piezoelectric element sample 20 includes a lower electrode layer 22, a growth control layer 24, and a piezoelectric film 26 on a substrate 21 having a size of 25 mm×25 mm, and it includes a buffer layer 27 and an upper electrode layer 28 patterned on a piezoelectric film 26 for evaluation. The buffer layer 27 and the upper electrode layer 28 have a circular form having a diameter of 400 μm.

Preparation Method for Piezoelectric Element Sample 20

Film Formation Substrate 23

A film formation substrate 23 including a lower electrode layer 22 in which a Ti layer having a thickness of 10 nm and an Ir layer having a thickness of 150 nm were sequentially laminated on a 25 mm square Si substrate 21 on which a thermal oxide film of 1 μm was formed was prepared.

Formation of Film of Growth Control Layer 24

A sputtering apparatus manufactured by Pascal Corporation, which is capable of independently controlling a plurality of targets, was used. The film formation substrate 23 was placed inside the sputtering apparatus, argon (Ar) was allowed to flow so that the vacuum degree was 0.8 Pa, and the substrate temperature was set to be 500° C. In order to form the growth control layer 24 having a different compositional ratio, a film of the growth control layer 24 was formed by using a co-sputtering method using a plurality of targets. It is noted that the adjustment of the composition of the growth control layer 24 and the like were the same as those of the buffer layer 27 described later. Ba was used as M of $M_dN_{1-d}O_e$, where Ru was used as N. The composition and thickness of the growth control layer in each sample were as shown in Table 1 below. A sample not including the growth control layer 24 is described as "Absent" in the column of the growth control layer in Table 1 below.

Formation of Film of Piezoelectric Film 26

A radio frequency (RF) sputtering apparatus (MPS type, a sputtering apparatus manufactured by ULVAC, Inc.) was used as the film forming apparatus. As a target material, a sintered body of $Pb(Zr_{0.52-d/2}Ti_{0.48-d/2}Nb_d)$ having a diameter of 120 mm was used. Here, the Nb doping amount was set to d=0.12. The distance between the target and the substrate was set to 60 mm. The film formation substrate 23 including the growth control layer 24 was placed inside the RF sputtering apparatus, and a film of a PZT film doped with Nb, having a layer thickness of 1 to 3 μm, was formed as the piezoelectric film 26 under the conditions of a vacuum degree of 0.3 Pa, an $Ar/O_2$ mixed atmosphere ($O_2$ volume fraction: 2.0%), and an input power of 500 W to the target. The substrate temperature was set to 600° C. in a case where the growth control layer was present or 750° C. in a case where the growth control layer was absent.

Buffer Layer 27

A sputtering apparatus manufactured by Pascal Corporation, which is capable of independently controlling a plurality of targets, was used. The film formation substrate 23 including the piezoelectric film 26 was placed inside the sputtering apparatus, argon (Ar) was allowed to flow so that the vacuum degree was 0.8 Pa, and the substrate temperature was set to be 500° C. In order to form the buffer layer 27 having a different compositional ratio, a co-sputtering method using a plurality of targets was used. It is noted that at the time of co-sputtering, the substrate 23 and the target were obliquely disposed instead of the target being disposed directly below the substrate. This makes it possible to simultaneously sputter a plurality of targets in the same environment to form a film. By controlling the power applied to each target at the time of film formation, the buffer layer 27 having a different composition was formed. Ba or Ba and Sr were used as M of $M_dN_{1-d}O_e$, where Ru was used as N. In Table 1 below, the numerical values in the columns of Ba and Sr are the proportions of Ba and Sr in M. For example, in Table 1, a case of Ba=1, Sr=0, and d=0.45 in the sample No. 1 means that the buffer layer is $Ba_{0.45}Ru_{0.55}O_e$. In addition, a case of Ba=0.57, Sr=0.43, and d=0.39 in sample No. 14 means that the buffer layer is $Ba_{0.22}Sr_{0.17}Ru_{0.61}O_e$.

It is noted that before forming a film of the buffer layer 27 having a different compositional ratio, the evaluation of the composition of the buffer layer composition was carried out in advance, and the condition setting for obtaining the buffer layer 27 having a desired compositional ratio was carried out. Specifically, a substrate was separately prepared for the evaluation of the composition of the buffer layer, the composition evaluation was carried out by X-ray fluorescence (XRF), and the composition condition was determined. A fluorescence X-ray apparatus Axios manufactured by Malvern Panalytical Ltd. was used as an evaluation apparatus. In the condition setting process, the layer thickness for the composition evaluation was set to 300 nm in order to obtain a sufficient fluorescent X-ray intensity. For the layer thickness measurement, a stylus layer thickness meter Dektak 6M manufactured by ULVAC, Inc. was used. In the condition setting, the composition was controlled by adjusting the input power to each target at the time of the sputter film formation. In addition, the film formation time was adjusted to obtain a desired layer thickness. Using the conditions obtained in this way, a sample 20 including the buffer layer 27 having each composition and each thickness shown in Table 1 below was prepared. A sample not including the buffer layer 27 is described as "Absent" in the column of the growth control layer in Table 1 below.

Upper Electrode Layer (Electrode Pattern for Evaluation)

The film formation substrate 23 including the buffer layer 27 was placed in the RF sputtering apparatus, and a film of an upper electrode layer consisting of an Ir layer was formed in a state where Ar was allowed to flow so that the vacuum degree was 0.58 Pa. It is noted that for the sample Nos. 20 and 21, an upper electrode layer having a two-layer structure of Ti of 20 nm and Ir of 100 nm was used. It is noted that among Ti and Ir, Ti was disposed on the piezoelectric film 26 side.

It is noted that in order to obtain the patterned buffer layer 27 and the upper electrode layer 28 illustrated in FIG. 4, a resist pattern having an opening of 400 μm diameter was formed on the piezoelectric film 26 before the buffer layer 27 was formed, and the resist pattern was removed after a film of the buffer layer 27 and a film of the upper electrode layer 28 were formed.

Evaluation of Long-Term Drive

A direct-current voltage of −40 V was applied between the lower electrode layer 22 and the upper electrode layer 28, and the change in the capacitance after 3 hours was measured. The capacitance was measured at the start of the voltage application and after 3 hours from the start of the voltage application. A case where the capacitance was decreased by 30% or more from the initial stage was evaluated as B, and a case where the capacitance was not decreased was evaluated as A. It was determined that in a case where the decrease in the capacitance after 3 hours from the start of the voltage application was suppressed to less than 30%, the deterioration of the piezoelectric characteristics in a case where the voltage application was repeated can be suppressed.

Table 1 below shows the layer configuration and the evaluation results of each sample of the test example.

TABLE 1

| Sample No. | Lower electrode layer | Growth control layer M = Ba | | | Piezo-electric film | Buffer layer M | | | | | Upper electrode layer | | Change in capacitance |
| | | Electro-negativity | d | N | Thickness (nm) | Thickness (μm) | Ba | Sr | Electro-negativity | d | N | Thickness (nm) | Thickness (nm) | |
| 1 | Ti/Ir | Absent | | | | 3 | 1 | 0 | 0.89 | 0.45 | Ru | 20 | Ir 100 | A |
| 2 | Ti/Ir | Absent | | | | 3 | 1 | 0 | 0.89 | 0.45 | Ru | 5 | Ir 100 | A |
| 3 | Ti/Ir | Absent | | | | 3 | 1 | 0 | 0.89 | 0.45 | Ru | 50 | Ir 100 | A |
| 4 | Ti/Ir | Absent | | | | 2 | 1 | 0 | 0.89 | 0.45 | Ru | 200 | Ir 100 | A |

TABLE 1-continued

| Sample No. | Lower electrode layer | Growth control layer M = Ba Electro-negativity | d | N | Growth control layer Thick-ness (nm) | Piezo-electric film Thick-ness (μm) | Buffer layer M Ba | Sr | Electro-negativity | d | N | Buffer layer Thick-ness (nm) | Upper electrode layer Thick-ness (nm) | Change in capaci-tance |
|---|---|---|---|---|---|---|---|---|---|---|---|---|---|---|
| 5 | Ti/Ir | 0.89 | 0.5 | Ru | 5 | 3 | 1 | 0 | 0.89 | 0.45 | Ru | 5 | Ir | 100 | A |
| 6 | Ti/Ir | 0.89 | 0.5 | Ru | 10 | 3 | 1 | 0 | 0.89 | 0.45 | Ru | 50 | Ir | 100 | A |
| 7 | Ti/Ir | Absent | | | | 2 | 1 | 0 | 0.89 | 0.2 | Ru | 5 | Ir | 100 | A |
| 8 | Ti/Ir | Absent | | | | 3 | 1 | 0 | 0.89 | 0.3 | Ru | 5 | Ir | 100 | A |
| 9 | Ti/Ir | Absent | | | | 3 | 1 | 0 | 0.89 | 0.45 | Ru | 5 | Ir | 100 | A |
| 10 | Ti/Ir | Absent | | | | 2 | 1 | 0 | 0.89 | 0.5 | Ru | 5 | Ir | 100 | A |
| 11 | Ti/Ir | Absent | | | | 3 | 1 | 0 | 0.89 | 0.63 | Ru | 5 | Ir | 100 | A |
| 12 | Ti/Ir | Absent | | | | 3 | 1 | 0 | 0.89 | 0.72 | Ru | 5 | Ir | 100 | A |
| 13 | Ti/Ir | Absent | | | | 1 | 1 | 0 | 0.89 | 1 | Absent | 5 | Ir | 100 | A |
| 14 | Ti/Ir | Absent | | | | 2 | 0.57 | 0.43 | 0.92 | 0.39 | Ru | 10 | Ir | 100 | A |
| 15 | Ti/Ir | Absent | | | | 3 | 0.18 | 0.82 | 0.94 | 0.35 | Ru | 10 | Ir | 100 | A |
| 16 | Ti/Ir | Absent | | | | 3 | 0.60 | 0.40 | 0.91 | 0.55 | Ru | 10 | Ir | 100 | A |
| 17 | Ti/Ir | Absent | | | | 3 | 0.90 | 0.10 | 0.90 | 0.83 | Ru | 10 | Ir | 100 | A |
| 18 | Ti/Ir | Absent | | | | 1 | 0.30 | 0.70 | 0.93 | 0.70 | Ru | 10 | Ir | 100 | A |
| 19 | Ti/Ir | Absent | | | | 3 | 0.21 | 0.79 | 0.94 | 0.52 | Ru | 10 | Ir | 100 | A |
| 20 | Ti/Ir | Absent | | | | 3 | 0 | 1 | 0.95 | 0.2 | Ru | 10 | Ir | 100 | B |
| 21 | Ti/Ir | Absent | | | | 3 | 0 | 1 | 0.95 | 0.7 | Ru | 10 | Ir | 100 | B |
| 22 | Ti/Ir | Absent | | | | 3 | Absent | | | | | | Ti/Ir | 20/100 | B |
| 23 | Ti/Ir | 0.89 | 0.5 | Ru | 5 | 1 | Absent | | | | | | Ti/Ir | 20/100 | B |

As shown in Table 1, the deterioration of the piezoelectric characteristics is suppressed in the sample Nos. 1 to 19, but the deterioration of the capacitance can not be suppressed in the sample Nos. 20 to 23.

Figure 5:
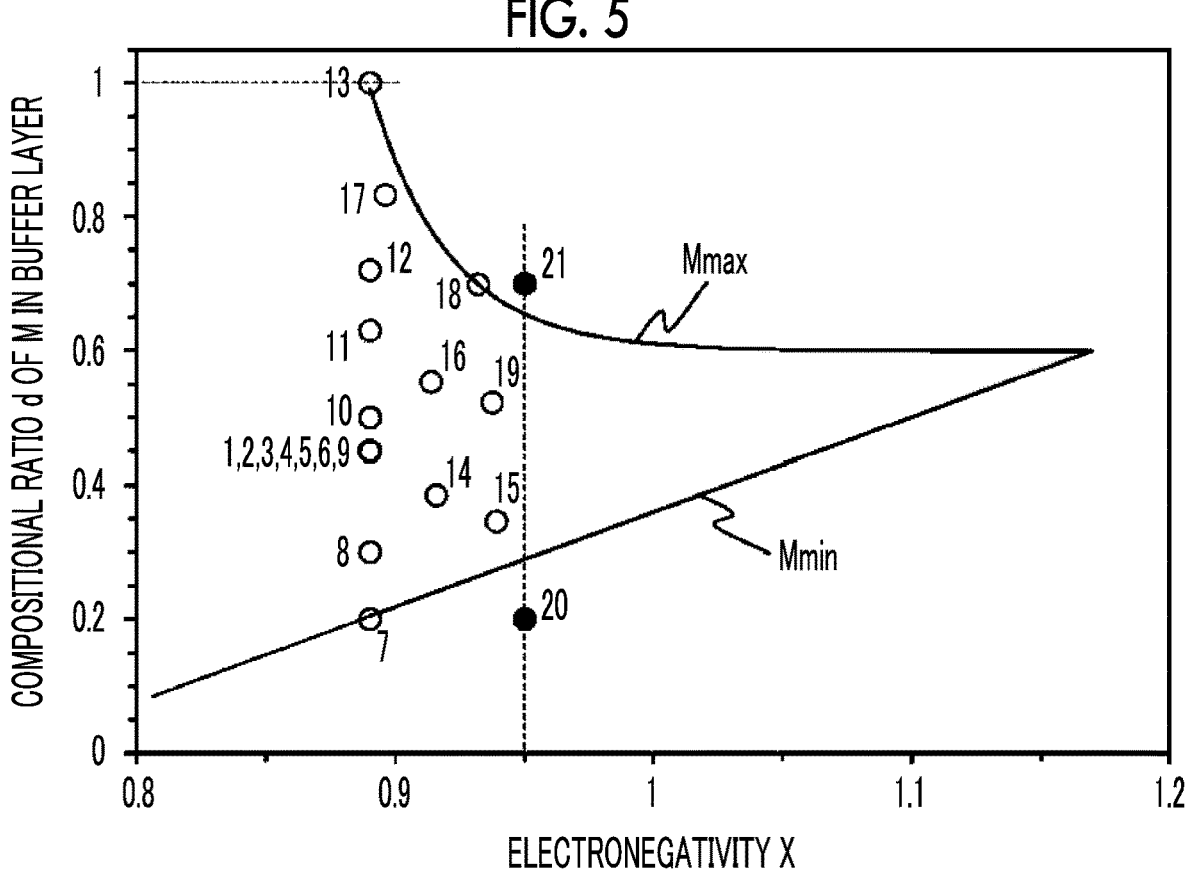
FIG. 5 is a graph showing an electronegativity and a compositional ratio d of a growth control layer for a sample of a test example.

FIG. 5 shows a graph in which, among the samples shown in Table 1, each sample including a buffer layer is plotted with the horizontal axis indicating the electronegativity and the vertical axis indicating the compositional ratio d. In addition, $M_{max}$ and $M_{min}$ are also shown in FIG. 5. In FIG. 5, in Table 1, samples having an evaluation A is indicated by a white circle marker (○), and samples having an evaluation B is indicated by a black circle marker (●). The numbers assigned in the vicinity of the markers indicate the sample No. As shown in FIG. 5, the region sandwiched between the functions $M_{max}$ and $M_{min}$ was occupied by all the samples evaluated as A or B. Based on the above test results, the possible electronegativity and compositional ratio of the buffer layer were defined as $M_{max} \le d \le M_{min}$ and X<0.95.

The disclosure of JP2020-127689 filed on Jul. 28, 2020, is incorporated in the present specification by reference in its entirety.

All documents, patent applications, and technical standards described in the present specification are incorporated herein by reference, to the same extent as in the case where each of the documents, patent applications, and technical standards is specifically and individually described.

What is claimed is:

1. A piezoelectric film-attached substrate comprising, on a substrate in the following order:
a lower electrode layer;
a piezoelectric film; and
a buffer layer,
wherein the piezoelectric film contains a perovskite-type oxide represented by General Formula $ABO_3$, the perovskite-type oxide containing lead as a main component of an A site,
the buffer layer contains a first metal oxide represented by General Formula (1), $$M_d N_{1-d} O_e \quad (1)$$

M consists of one or more metal elements substitutable for the A site of the perovskite-type oxide and has an electronegativity of less than 0.95,
N includes, as a main component, at least one selected from the group of Sc, Zr, V, Nb, Ta, Cr, Mo, W, Mn, Fe, Ru, Co, Ir, Ni, Cu, Zn, Ga, Sn, In, and Sb,
O is an oxygen element, and
d and e represent a compositional ratio, which satisfies 0<d<1 and 1≤e≤3, and in a case where the electronegativity is denoted by X, $$1.41X-1.05 \le d \le A1 \cdot \exp(-X/t1)+y0$$

A1=1.68×10^{12}, t1=0.0306, and y0=0.59958.

2. The piezoelectric film-attached substrate according to claim 1, further comprising:
a growth control layer between the lower electrode layer and the piezoelectric film,
wherein the growth control layer contains a second metal oxide represented by General Formula (1).

3. The piezoelectric film-attached substrate according to claim 1,
wherein the first metal oxide contained in the buffer layer, M of General Formula (1) includes, as a main component, at least one selected from the group of Li, Na, K, Mg, Ca, Sr, Ba, La, Cd, and Bi.

4. The piezoelectric film-attached substrate according to claim 1,
wherein the first metal oxide contained in the buffer layer, M of General Formula (1) contains Ba as a main component.

5. The piezoelectric film-attached substrate according to claim 1,
wherein the first metal oxide contained in the buffer layer, M of General Formula (1) is Ba.

6. The piezoelectric film-attached substrate according to claim 1,
wherein the first metal oxide contained in the buffer layer, d in General Formula (1) is 0.2≤d.

7. The piezoelectric film-attached substrate according to claim 1, wherein the first metal oxide contained in the buffer layer, d in General Formula (1) is $$0.3 \leq d.$$

8. The piezoelectric film-attached substrate according to claim 1, wherein the first metal oxide contained in the buffer layer, d in General Formula (1) is $$0.45 \leq d.$$

9. A piezoelectric element comprising:

the piezoelectric film-attached substrate according to claim 1; and an upper electrode layer provided on the buffer layer.

\* \* \* \* \*